(12) United States Patent
Chou et al.

(10) Patent No.: US 9,343,424 B2
(45) Date of Patent: May 17, 2016

(54) STRUCTURE OF CIRCUIT BOARD WITH VOIDS

(71) Applicant: Wistron Corporation, New Taipei (TW)

(72) Inventors: Hui-Ying Chou, New Taipei (TW); Lee-Chieh Kang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 14/730,327

(22) Filed: Jun. 4, 2015

(65) Prior Publication Data

US 2015/0270213 A1 Sep. 24, 2015

Related U.S. Application Data

(62) Division of application No. 14/219,042, filed on Mar. 19, 2014, now Pat. No. 9,159,697.

(30) Foreign Application Priority Data

Oct. 15, 2013 (TW) .............................. 102137165 A

(51) Int. Cl.
*H01L 23/48* (2006.01)
*H01L 23/52* (2006.01)
(Continued)

(52) U.S. Cl.
CPC ................ *H01L 24/81* (2013.01); *H01L 23/13* (2013.01); *H01L 23/528* (2013.01);
(Continued)

(58) Field of Classification Search
CPC .................. H01L 2924/14; H01L 2924/01079; H01L 2924/01013; H01L 2924/01029; H01L 2924/01078; H01L 23/49816; H01L 2224/48091; H01L 21/76843; H01L 21/76838; H01L 21/76877; H01L 23/5226; H01L 24/81; H01L 23/53204; H01L 23/528; H01L 23/13

USPC ................... 257/773, 669, 676, 680, 731, 786

See application file for complete search history.

(56) References Cited

U.S. PATENT DOCUMENTS

| | | | |
|---|---|---|---|
| 2010/0204667 A1* | 8/2010 | Chakravarthy | ..... A61F 13/0279 604/369 |
| 2011/0309515 A1 | 12/2011 | Yokoyama | |

(Continued)

OTHER PUBLICATIONS

"Military Standard"; Printed Wiring for Electronic Equipment; Downloaded from http://www.everyspec.com; Department of Defense, Washington, D.C.; Dec. 31, 1984.

*Primary Examiner* — A. Sefer
*Assistant Examiner* — Dilinh Nguyen
(74) *Attorney, Agent, or Firm* — McClure, Qualey & Rodack, LLP

(57) ABSTRACT

A method for forming voids corresponding to pads of SMT components is provided. The method comprises following steps: One or more condition parameters are inputted into a searching unit. The searching unit searches all of the pads with reference to the condition parameters to obtain a pre-selected group of pads. A judgment unit is provided to determine whether each pad of the pre-selected group of pads meets a pre-determined processing requirement to generate a to-be-processed group of pads. An execution unit executes a void formation step with reference to corner coordinates of each of the to-be-processed group of pads, so as to form at least a void at the portion of a contact surface corresponding to a corner of the pad. In an embodiment, four voids which are related to respective corners of each pad of the to-be-processed group are formed at the contact surface accordingly.

4 Claims, 8 Drawing Sheets

(51) Int. Cl.
*H01L 29/40* (2006.01)
*H01L 23/495* (2006.01)
*H01L 23/02* (2006.01)
*H01L 23/12* (2006.01)
*H01L 23/00* (2006.01)
*H01L 23/13* (2006.01)
*H05K 3/00* (2006.01)
*H01L 23/528* (2006.01)
*H01L 23/532* (2006.01)
*H05K 3/34* (2006.01)
*H05K 3/40* (2006.01)

(52) U.S. Cl.
CPC ....... *H01L 23/53204* (2013.01); *H05K 3/0005* (2013.01); *H05K 3/3442* (2013.01); *H05K 3/4007* (2013.01); *H05K 2201/0969* (2013.01); *H05K 2201/10636* (2013.01); *Y02P 70/611* (2015.11)

(56) References Cited

U.S. PATENT DOCUMENTS

2012/0112354 A1  5/2012  Hirano et al.
2013/0256883 A1  10/2013  Meyer et al.
2014/0167263 A1  6/2014  Wu et al.

\* cited by examiner

☐ :By Layer

☑ :Include All *201*,*402*,and *603* packages

☑ :Include From File [ ... ]

Min void area to be delete [sq mil]: [ 512 ]

[ add SMD Thermal ]

STRUCTURE OF CIRCUIT BOARD WITH VOIDS

CROSS REFERENCE TO RELATED APPLICATIONS

This application is a Divisional of U.S. patent application Ser. No. 14/219,042, filed Mar. 19, 2014, and entitled "METHOD FOR FORMING VOIDS AND STRUCTURE WITH VOIDS FORMED USING THE SAME", now U.S. Pat. No. 9,159,697. This application claims the benefit of Taiwan application Serial No. 102137165, filed Oct. 15, 2013, the subject matter of which is incorporated herein by reference.

BACKGROUND OF THE DISCLOSURE

1. Field of the Disclosure

The disclosure relates in general to a method for forming voids and a structure with voids formed using the same, and more particularly to a method for forming voids capable of resolving tombstone effect for components and a structure thereof.

2. Description of the Related Art

Along with the miniaturization and sophistication of electric products, such as photoelectric, communication and semiconductor products, the components used in laptops or mobile devices are getting slimmer and lighter. However, the surface mount technology (SMT) used for disposing components will result in more and more defects as the number of small components increases.

In the design of printed circuit board, if the pad located at one end of an element contacts a large copper foil while the pad located at the other end does not contact a large copper foil, the temperature of the pads at two ends of the element will be different during the reflowing process. FIG. 1A~FIG. 1D are schematic diagrams of an element tombstone effect. As indicated in FIG. 1A, the solders 12a and 12b on the pads located at two ends of the element 11 are not melted and deformed. During reflow, the solders 12a and 12b approach reflow temperature, and the solders 12a and 12b begin to wet unevenly. The pads 12 are heated at different temperatures, the solder 12a at a higher temperature will be melted faster than the solder 12b at a lower temperature. Also, surface tension and torque increase on one side of the solder (such as the solder 12a). As indicated in FIG. 1B, the element 11 tilts at one end and causes the melted solder 12a' to tumble down. As indicated in FIG. 1C, during the melting process, the solder 12a', being affected by unstable temperature in the finance and track vibration, will flow towards the solder 12b' located at the right hand side, and the surface tension will make the element 11 rotated and standing on end during reflow as indicated in FIG. 1D. Such phenomenon is called a 'tombstone effect'. The lighter the element, the easier to pull the element upward and make the element stand on end during reflow.

SUMMARY OF THE DISCLOSURE

The disclosure is directed to a method for forming voids and a structure with voids formed using the same. Through logic operation, a data processor effectively executes a void formation step on selected pads to form voids at the portion of a contact surface (such as a copper foil) corresponding to respective corners of the pad (such as the four corners of the pad) to effectively reduce the tombstone effect of components.

According to one embodiment of the present disclosure, a method for forming voids is provided. The method at least comprises:

inputting one or more condition parameters into a searching unit;

searching all of the pads with reference to the one or more condition parameters by the searching unit to obtain a pre-selected group of pads;

providing a judgment unit to determine whether each pad of the pre-selected group of pads meets a pre-determined processing requirement to generate a to-be-processed group of pads; and providing an execution unit to execute a void formation step with reference to corner coordinates of each pad of the to-be-processed group of pads, so as to form at least a void at the portion of a contact surface corresponding to a corner of the pad.

In an embodiment, four voids which are related to respective corners of each pad of the to-be-processed group are formed at the contact surface accordingly.

According to another embodiment of the present disclosure, a structure with voids is provided. The structure comprises a circuit board and a pad. The circuit board at least comprises a copper foil having a pad region. The pad region has at least a void with width $X_V$ and length $Y_V$. A perimeter of the void is equal to two times the sum of the width $X_V$ and the length $Y_V$. A pad with width $X_P$ and length $Y_P$ is disposed in the pad region for electrically connecting an element of the pad to the circuit board. The perimeter of the pad is equal to two times the sum of the width $X_P$ and the length $Y_P$. The void in the pad region corresponds to a corner of the pad. The width $X_P$ and the length $Y_P$ of the pad correspond to the width $X_V$ and the length $Y_V$ of the void, respectively. The pad has a minimum wire width W, and the difference obtained by deducting the perimeter of the void from the perimeter of the pad must be greater than or equal to the minimum wire width W.

The above and other aspects of the disclosure will become better understood with regard to the following detailed description of the preferred but non-limiting embodiment(s). The following description is made with reference to the accompanying drawings.

DETAILED DESCRIPTION OF THE DISCLOSURE

A method for forming voids and a structure with voids formed using the same are provided in embodiments of the disclosure. By forming at least a void at a portion of a contact surface (such as a copper foil) corresponding to a corner of a pad (such as four corners of the pad), the contact area between the pad and the contact surface (such as the copper foil) is sufficient, characteristics of elements are maintained, the dissipation rate is increased, the probability of surface tension on melted pad being decreased is lowered, and the tombstone effect of the components is greatly reduced.

Figure 1A:
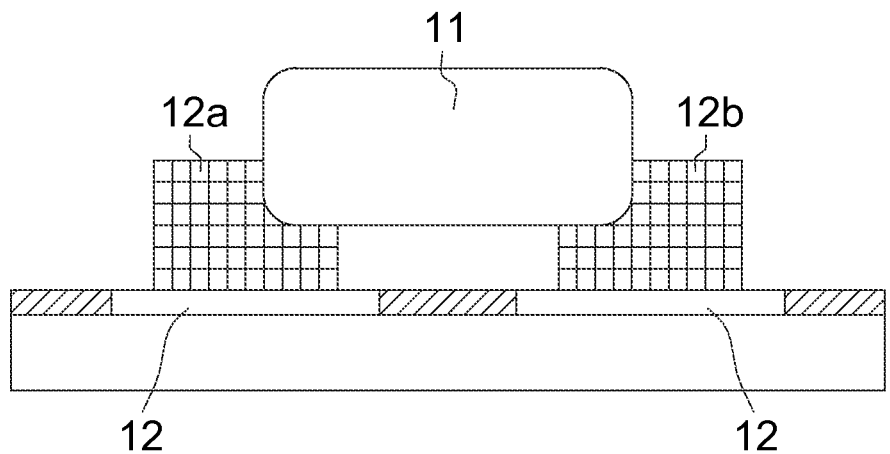
FIG. 1A~FIG. 1D (Prior Art) are schematic diagrams of an element tombstone effect.
Figure 1B:
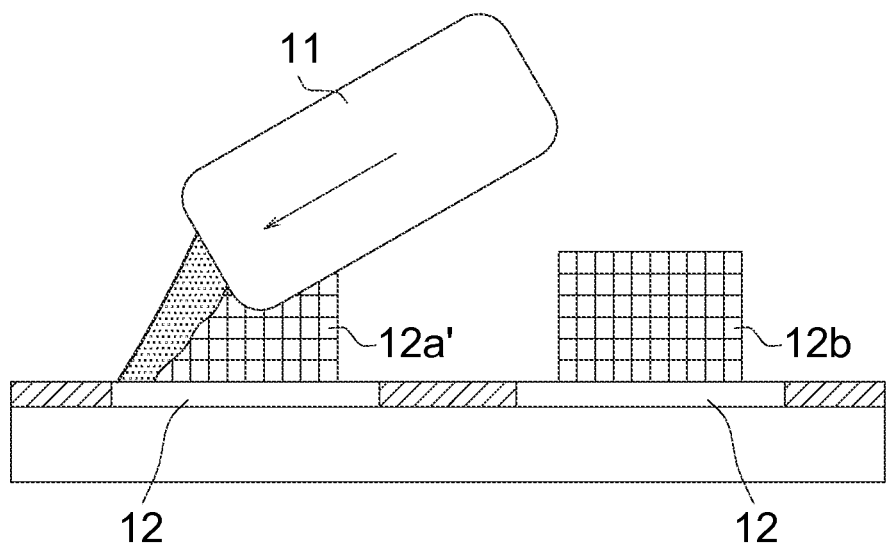
Figure 1C:
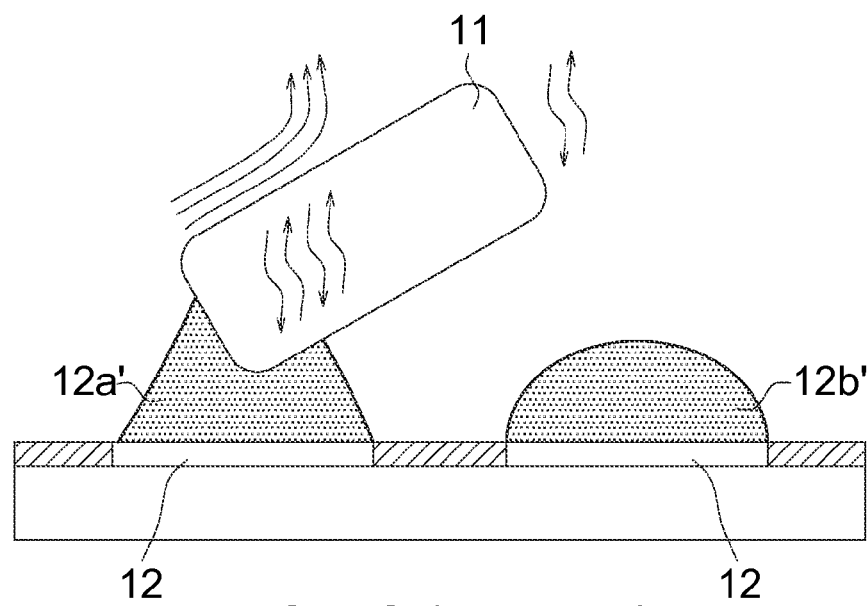
Figure 1D:
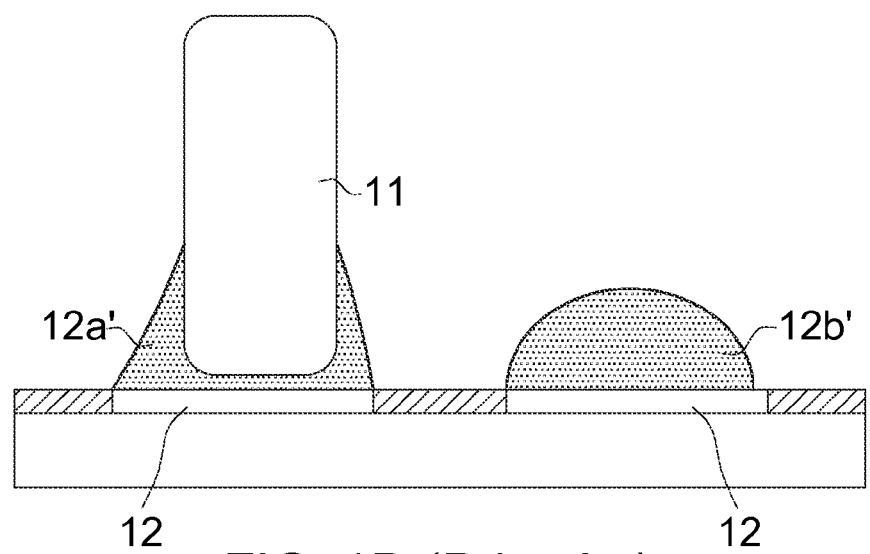
Figure 2:
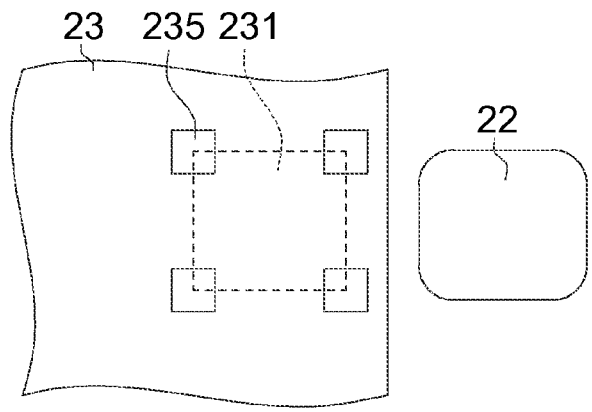
FIG. 2 is a schematic diagram of a structure with voids according to an embodiment of the disclosure.

FIG. 2 is a schematic diagram of a structure with voids according to an embodiment of the disclosure. A pad 22, electrically connecting element and a circuit board, is disposed in a pad region 231 on a copper foil 23. Conventionally, the entire pad is conducted with a copper foil 23, that is, a bottom surface of the pad completely contacts the copper foil 23. In the present embodiment, at least a void 235 corresponding to a corner of the pad 22 is formed in the pad region 231. As indicated in FIG. 2, the pad region 231 has four voids 235 corresponding to four corners of the pad 22, respectively. When the pad 22 is disposed in the pad region 231, the formation of voids 235 helps to increase the dissipation rate and avoid the tombstone effect.

The circuit board has many components disposed thereon and the components may have different sizes. Small components, such as resistor/inductor/capacitor (R/L/C) with package sizes: 0201/0402/0603, are susceptible to the tombstone effect. In general, the size of package component has nothing to do with resistance but is closely related with power. For instance, the watts corresponding to package sizes 0201, 0402, 0603, 0805, and 1206 are $\frac{1}{20}$W, $\frac{1}{16}$W, $\frac{1}{10}$W, $\frac{1}{8}$W, and $\frac{1}{4}$W, respectively. The corresponding relationship between package size and appearance size of capacitor/resistor is: 0402=1.0 mm×0.5 mm, 0603=1.6 mm×0.8 mm, 0805=2.0 mm×1.2 mm, 1206=3.2 mm×1.6 mm, 1210=3.2 mm×2.5 mm, 1812=4.5 mm×3.2 mm, 2225=5.6 mm×6.5 mm. Component package refers to the indicated appearance of components soldered to the circuit board and positions of soldered dots. Different elements may share the same component package, and the same elements may have different component packages.

In general, 70% of the components on the printed circuit board are resistor/inductor/capacitor (R/L/C) with package sizes: 0201/0402/0603. It would be too time-consuming to hollow the portion by which a copper foil contacting the four corners of a pad for every component. Furthermore, the sizes and positions of the hollowed portions are irregular. Therefore, the disclosure provides a method for forming voids on a printed circuit board by a data processor to effectively avoid the tombstone effect.

Figure 3:
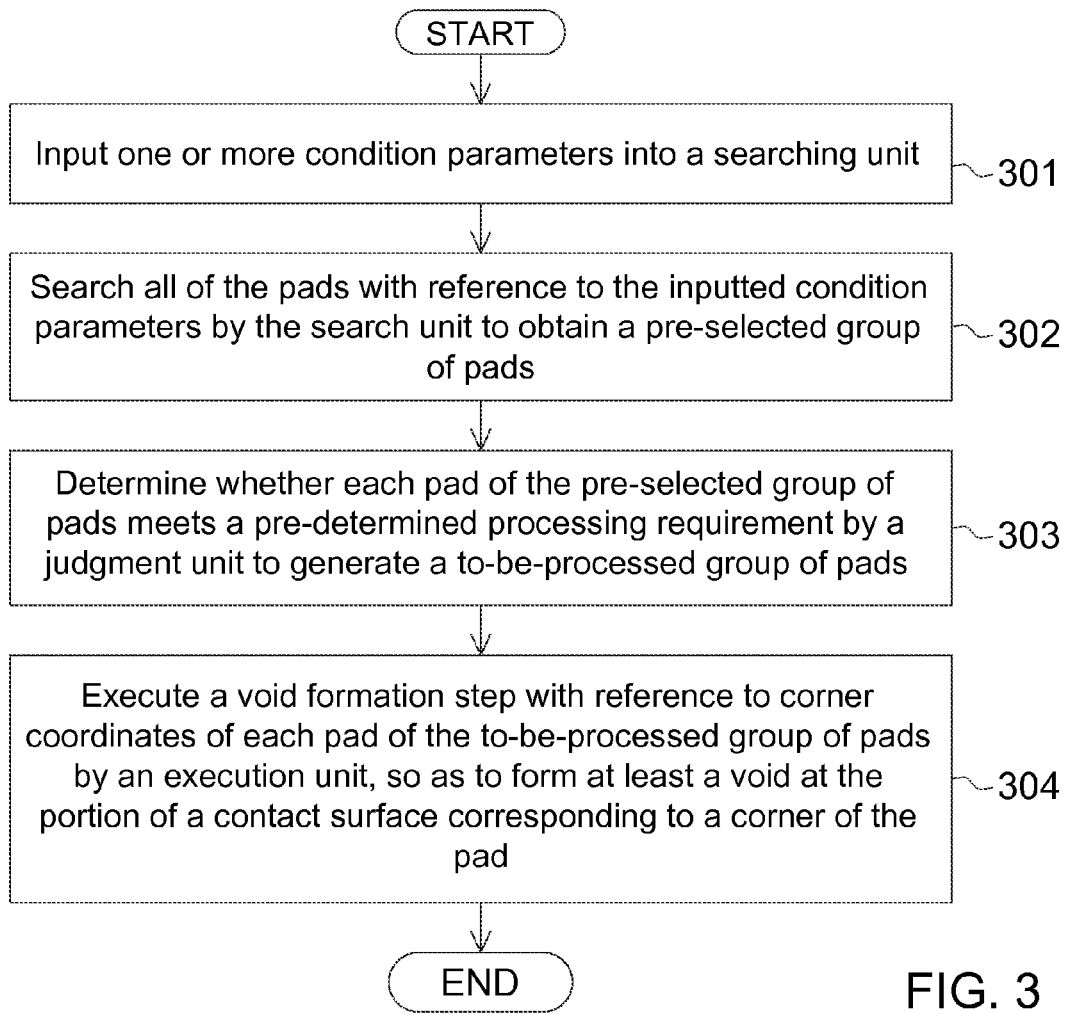
FIG. 3 is a flowchart of a method for forming voids of the disclosure.

Referring to FIG. 3, a flowchart of a method for forming voids of the disclosure is shown. In step 301, one or more condition parameters are inputted into a searching unit (such as a logic unit of a data processor). In step 302, the search unit searches all of the pads with reference to the inputted condition parameters to obtain a pre-selected group of pads. In step 303, a judgment unit is provided to determine whether each pad of the pre-selected group of pads meets a pre-determined processing requirement to generate a to-be-processed group of pads. In step 304, an execution unit is provided to execute a void formation step with reference to corner coordinates of each pad of the to-be-processed group of pads, so as to form at least a void (such as void 235 of FIG. 2) at the portion of a contact surface corresponding to a corner of the pad.

Detailed descriptions related to the embodiments of the disclosure are disclosed below with reference to accompanying drawings. It should be noted that detailed steps and calculation disclosed in embodiments of the disclosure are exemplary and explanatory only and are not restrictive of the disclosed embodiments as claimed. Therefore, the descriptions and accompanying drawings of the disclosed embodiments are not for limiting the scope of protection of the disclosure.

Figure 4:
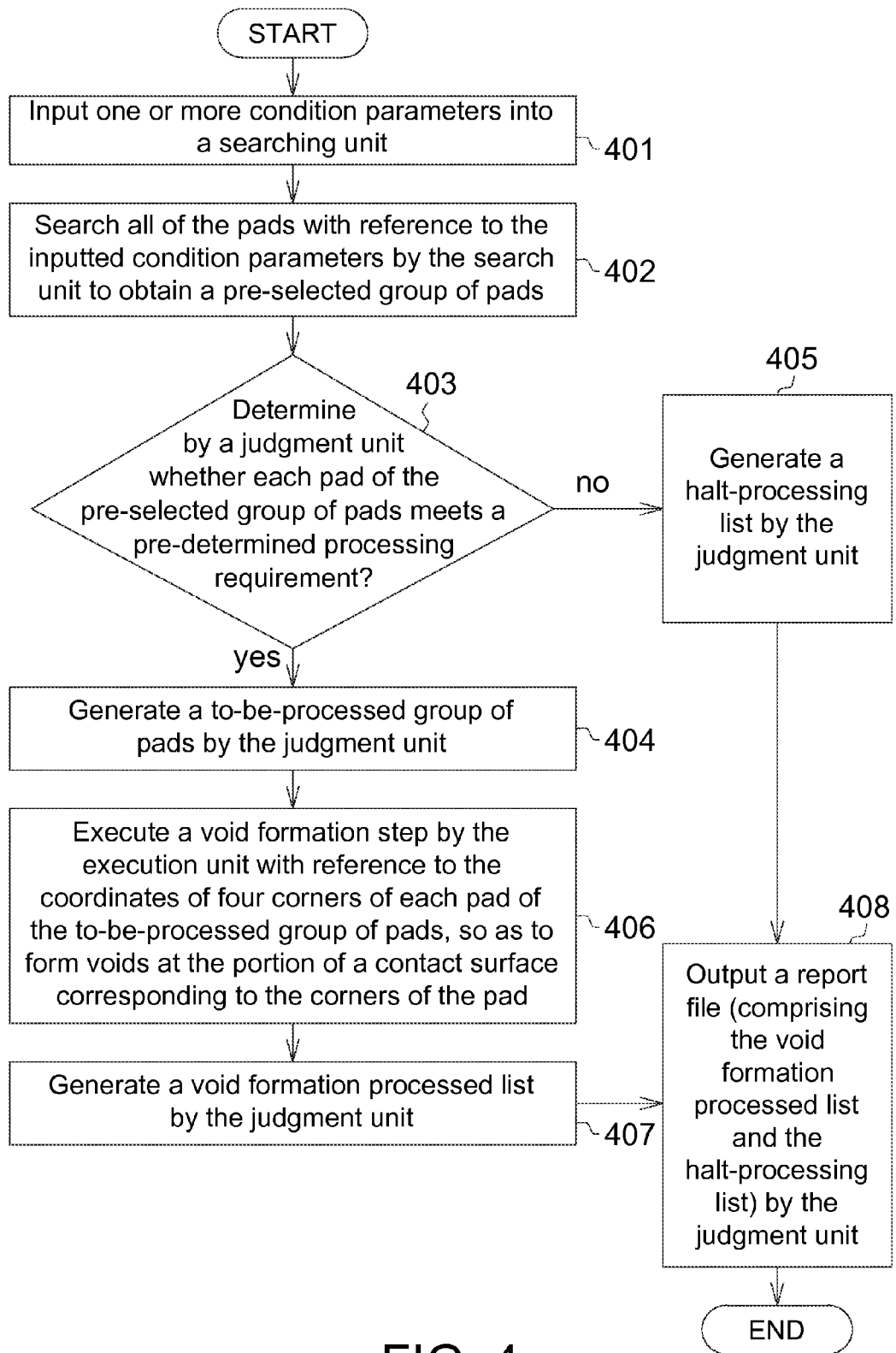
FIG. 4 is a flowchart of a method for forming voids according to an embodiment of the disclosure.

FIG. 4 is a flowchart of a method for forming voids according to an embodiment of the disclosure. In step 401, one or more condition parameters are inputted into a searching unit (such as a logic unit of a data processor). In an embodiment, the condition parameters, exemplarily but not restrictively, comprise: a condition parameter of selection by layer, a condition parameter of particular combination of element groups, a condition parameter of selection custom elements, and a condition parameter of setting a minimum void area.

Figures 5, 6:
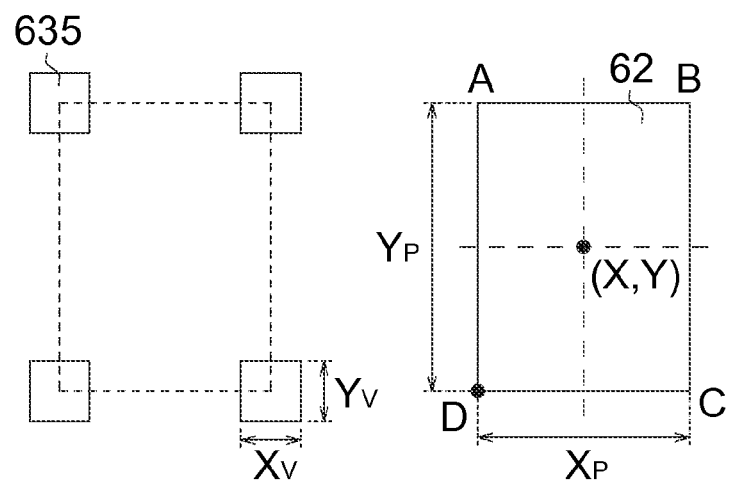
FIG. 5 is a schematic diagram of contents of the setting of condition parameter according to an embodiment of the disclosure.
FIG. 6 is a schematic diagram of position and corner coordinates of a pad.

Referring to FIG. 5, a schematic diagram of contents of the setting of condition parameter according to an embodiment of the disclosure is shown. Condition parameters are inputted through a program interface to adjust the range of operation, save the running time, and set correct execution targets. The pads requiring void formation can be selected with reference to ticked condition parameters. The condition parameters of FIG. 5 are described below.

By Layer: If this item is selected, void formation will be executed on the full layer. If this item is not selected, then some particular or user-defined regions will be selected instead. In comparison to the selection by layer, selection by region involves a smaller range of void formation, hence saving more running time.

Include All *201*, *402*, and *603* packages: If this item is selected, then the step of forming void corresponding to a corner of the pad will cover all components with package name *201*, *402*, or *603*. This item belongs to the condition parameter of selection by particular combination of element groups. For instance, if the item 'Include All *201*, *402*, and *603* packages' is selected, then all components with key word *805* in the region will be excluded from the processing list. In practical application, the content of the combination can be modified according to actual requirements and conditions, other combination of particular element groups can be added, and the package names are not limited to *201*, *402*, and *603* exemplified in FIG. 5.

Include From File: If this item is selected, which components must be selected can be defined in a text file. This item belongs to the condition parameter of selection by custom elements, and required package names can be inputted according to the needs in practical application. The present condition parameter can be selected together with the previous condition parameter of selection by a particular combination of element groups.

Min void area to be deleted [sq mil]: If this item is selected, then a minimum void area is set. Due to the limitation in the manufacturing ability of PCB manufacturers, if the minimum area of a void region is smaller than the minimum value, then the PCB manufacturers will not format the void 235. With the minimum void area being set, when the void area of the pad obtained in subsequent step is smaller than the set value, void formation is not executed.

In an embodiment, the condition parameters inputted through program interface may comprise the conditions of selecting components from different layers (such as an upper layer or a lower layer), and setting a minimum interval between the voids 235 of the pads of adjoining elements, and not executing void formation if the interval is smaller than the minimum interval. In practical application, the contents of condition parameters can be modified with reference to the conditions in actual application such that the provided program interface can meet actual needs and is not limited to the exemplification of FIG. 5.

In step 402, the searching unit searches all of the pads with reference to the inputted condition parameters to obtain a pre-selected group of pads. In an embodiment, the searching unit can generate a pre-selected list.

In step 403, the judgment unit determines whether each pad of the pre-selected group of pads meets a pre-determined processing requirement. If the judgment unit determines that a pad meets the pre-determined processing requirement, then the method proceeds to step 404. In step 404, the pad is categorized into a to-be-processed group of pads by the judgment unit. If the judgment unit determines that a pad does not meet the pre-determined processing requirement, then the method proceeds to step 405. In step 405, the pad is categorized into a halt-processing group of pads by the judgment unit.

In an embodiment, the pre-determined processing requirement for a pad is that the position coordinates of the pad of pre-selected group of pads are located in a copper region. The pads whose position coordinates are located in the copper region are determined by the judgment unit as meeting the pre-determined processing requirement, and are categorized into to-be-processed group of pads (step 404). The pads whose position coordinates are not located in the copper region do not need to be processed further and are categorized into a halt-processing group of pads (step 405).

In an embodiment, the judgment unit generates a halt-processing list after generating a halt-processing group of pads, and the halt-processing list can be combined and outputted together with a report file (step 408).

In step 406, the execution unit executes a void formation step with reference to the corner coordinates of at least a corner (such as four corners) of each pad of the to-be-processed group of pads, so as to form at least a void at the portion of a contact surface corresponding to a corner of the pad (such as void 235 of FIG. 2). In an embodiment, the pad is disposed on a copper foil, and the execution unit executes a void formation step on the portion of the copper foil contacted by the pad (corresponding to four corners of the pad), and the voids are formed on the copper foil.

In an embodiment, after the execution unit executes a void formation step, the judgment unit generates a void formation processed list (step 407), and outputs a report file which comprises a void formation processed list and a halt-processing list (step 408). The program pops a report file, and the method terminates.

<Calculation of Corner Coordinates of a Pad>

In an embodiment, the searching unit has a database storing package names of all elements, and the sizes and position coordinates of the pads corresponding to the elements. FIG. 6 is a schematic diagram of position and corner coordinates of a pad. The position coordinates of the pad stored in the database is such as the center coordinates (x, y). It is assumed that the pad 62 has a length $Y_P$ and a width $X_P$, then the coordinates of corners A, B, C and D of the pad 62 are: $(x-X_P/2, y+Y_P/2)$, $(x+X_P/2, y+Y_P/2)$, $(x+X_P/2, y-Y_P/2)$ and $(x-X_P/2, y-Y_P/2)$, respectively. The four voids 635 in the pad region correspond to the four corners A, B, C and D of the pad 62.

In an embodiment, the corner coordinates of the pad 62 can be calculated and inputted to the database before the selection of pads. In another embodiment, the corner coordinates of the pad 62 can be obtained with reference to the pads requiring void formation after the selection of pads (the judgment unit generates a to-be-processed group of pads). Suitable programs can be designed according to actual application, but the disclosure is not limited thereto.

Referring to FIG. 6. Suppose the pad has a length $Y_P$ and a width $X_P$. Then, the perimeter of the pad is equal to two times the sum of the width $X_P$ and the length $Y_P$. That is, the perimeter of the pad=$(Y_P+X_P)\times2$. Suppose the void 635 in the pad region has a length $Y_V$ and a width $X_V$. Then, the perimeter of the void is equal to two times the sum of the width $X_V$ and the length $Y_V$. That is, the perimeter of the void=$(Y_V+X_V)\times2$. The width $X_P$ and the length $Y_P$ of the pad 62 correspond to the width $X_V$ and the length $Y_V$ of the void 635 respectively. In an embodiment, exemplarily but not restrictively, the four voids are four squares of the same size.

<Calculation of Void Width ΔX>

In an embodiment, the judgment unit can obtain a void width ΔX corresponding to each corner of a pad according to a required wire width and a pad size of each element. In an embodiment, the required wire width of each element can be obtained with reference to a required load current of each element and a thickness of a copper foil (a contact surface) at which the pad is located.

Figure 7A:
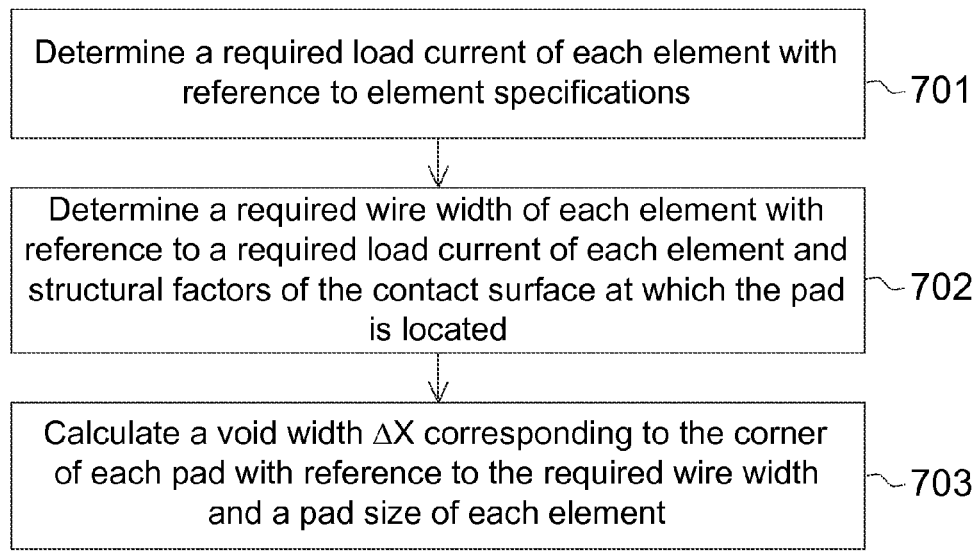
FIG. 7A is a flowchart of a method for calculating void width according to an embodiment of the disclosure.
Figure 7B:
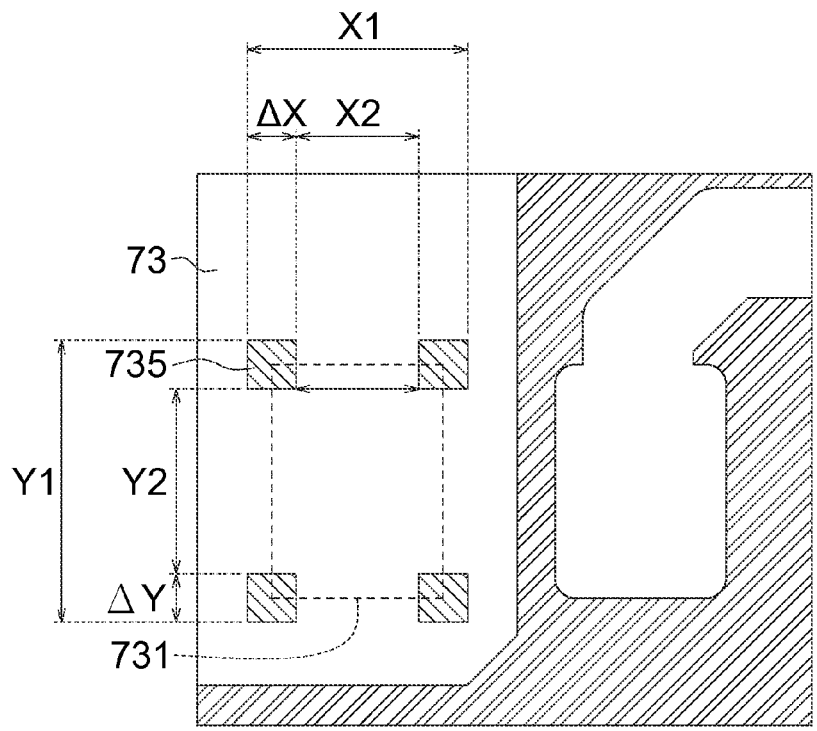
FIG. 7B is a schematic diagram of a pad and its corresponding pad region and voids according to an embodiment of the disclosure.

Referring to FIGS. 7A and 7B. FIG. 7A is a flowchart of a method for calculating void width according to an embodiment of the disclosure. FIG. 7B is a schematic diagram of a pad and its corresponding pad region and voids according to an embodiment of the disclosure. In an embodiment, the four corners of the pad can be arc-shaped or rectangular. The corners illustrated in FIG. 7B are arc-shaped, but the disclosure is not limited thereto. As indicated in FIG. 7B, the pad is disposed in the pad region 731 of the copper foil 73, and the four corners of the pad respectively correspond to the center of the voids 735.

Referring to FIG. 7A. In step 701, a required load current of each element is determined with reference to element specifications (such as by looking up relevant tables). In step 702, a required wire width of each element is determined with reference to a required load current of each element and a thickness of a copper foil at which the pad is located. In example 1, suppose the result of table search confirms that a particular element carries 2 A current. If the thickness of the copper foil at which the element is located is 35 μm, then the required wire width of the element can be obtained from formula (1-1). The calculation result shows that the required wire width is about 0.8 mm=31 mil.

Based on the design standards of printed circuit board such as IPC-2221 or IPC-4101, the required wire width of a component can be determined with reference to condition parameters such as copper foil thickness and maximum current.

$$W=(1/1.4h)*[I/(k*\Delta T^{0.421})]^{1.379} \qquad (1\text{-}1)$$

W: minimum wire width;
I: maximum current allowed;
ΔT: maximum temperature rise;
h: copper thickness (oz/μm²);
(h=25 μm if the copper wire is disposed in an inner layer and h=46 μm if the copper wire is disposed in an outer layer);
k: dielectric constant;
(k=0.024 if the copper wire is disposed in an inner layer and h=0.048 if the copper wire is disposed in an outer layer).

In step 703, a void width ΔX corresponding to the corner of each pad is calculated with reference to the required wire width and a pad size of each element. Referring to FIG. 6. The minimum wire width W is calculated according to formula (1-1), and the width of FIG. 6 being $[(Y_P+X_P)\times 2-(Y_V+X_V)\times 2]$ must be greater than or equal to W. Suppose $Y_P=X_P$ and $Y_V=X_V$. Then, $Y_P-Y_V \geq W/4$ or $X_P-X_V \geq W/4$. Referring to FIG. 7B. As disclosed in example 1, if one element requires a minimum wire width being 0.8 mm=31 mil, then the width of FIG. 7B being (Y2+X2)×2 must be greater than or equal to the minimum wire width being 31 mil. Suppose Y2=X2. Then, Y2=X2=31÷4≈8, and the void width ΔX≤(X1−8), wherein X1 is determined with reference to the pad size of the element (such as components 0201/0402/0603, and so on).

In an embodiment, in addition to the package names of all elements, and the sizes and position coordinates of the pads corresponding to the elements, the database further stores a void width ΔX corresponding to the corner of each pad. After the judgment unit generates a to-be-processed group of pads, the judgment unit can refer to the void width ΔX stored in the database, and controls the execution unit to form voids at the portion of a copper foil corresponding to the corner of each pad of the to-be-processed group of pads. The present embodiment is exemplified by a first application example below.

Figure 8:
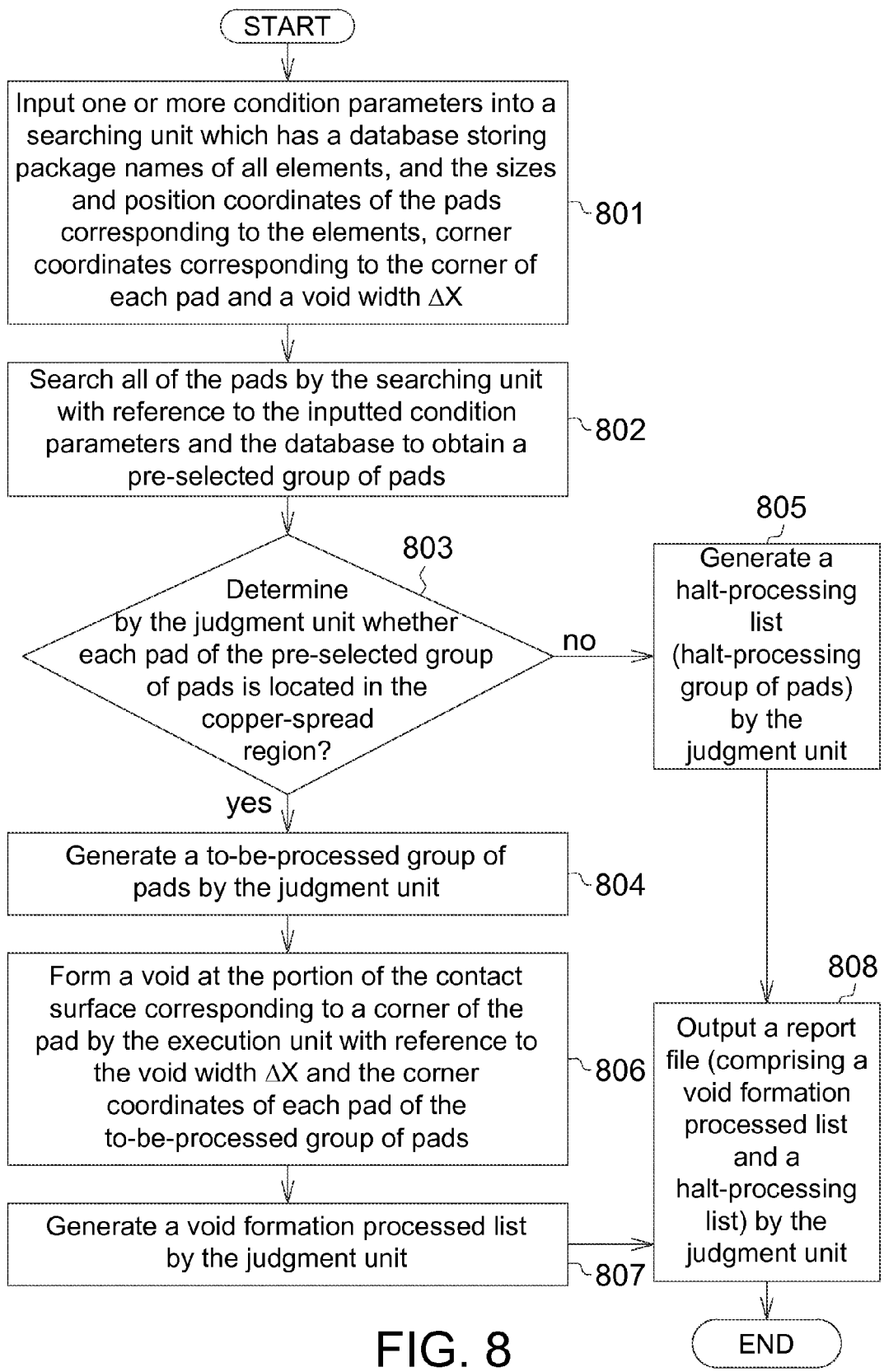
FIG. 8 is a flowchart of a method for forming voids according to a first application example of the disclosure.

FIG. 8 is a flowchart of a method for forming voids according to a first application example of the disclosure. In step 801, one or more condition parameters are inputted into a searching unit. The searching unit has a database storing package names of all elements, and the sizes and position coordinates of the pads corresponding to the elements, corner coordinates corresponding to the corner of each pad and a void width ΔX (obtained through calculation). In step 802, the searching unit searches all of the pads with reference to the inputted condition parameters and the database to obtain a pre-selected group of pads. In step 803, the judgment unit determines whether each pad of the pre-selected group of pads is located in the copper region (that is, meets a pre-determined processing requirement). If the pad is located in the copper region, then the method proceeds to step 804. In step 804, the pad is categorized into a to-be-processed group of pads pad by the judgment unit to generate a to-be-processed list. If the pad is not located in the copper region, then the method proceeds to step 805. In step 805, the pad is categorized into a halt-processing group of pads by the judgment unit which further generates a halt-processing list. In step 806, the execution unit forms a void at the portion of the contact surface corresponding to a corner of the pad with reference to the void width ΔX and the corner coordinates of each pad of the to-be-processed group of pads (obtained from the inputted values of the database). After the execution unit finishes the void formation step, the method proceeds to step 807. In step 807, the judgment unit generates a void formation processed list. In step 808, the judgment unit outputs a report file comprising a void formation processed list and a halt-processing list. The program pops a report file, and the method terminates.

In another embodiment, after generating a to-be-processed group of pads, the judgment unit may calculate corner coordinates of each pad of the to-be-processed group of pads and a void width ΔX corresponding to the corner with reference to the size and position coordinates of each pad stored in the database. Then, the execution unit obtains the void width ΔX and the corner coordinates of the pad through calculation so as to form a void at the portion of the contact surface corresponding to a corner of the pad. The present embodiment is exemplified by a second application example below.

Figure 9:
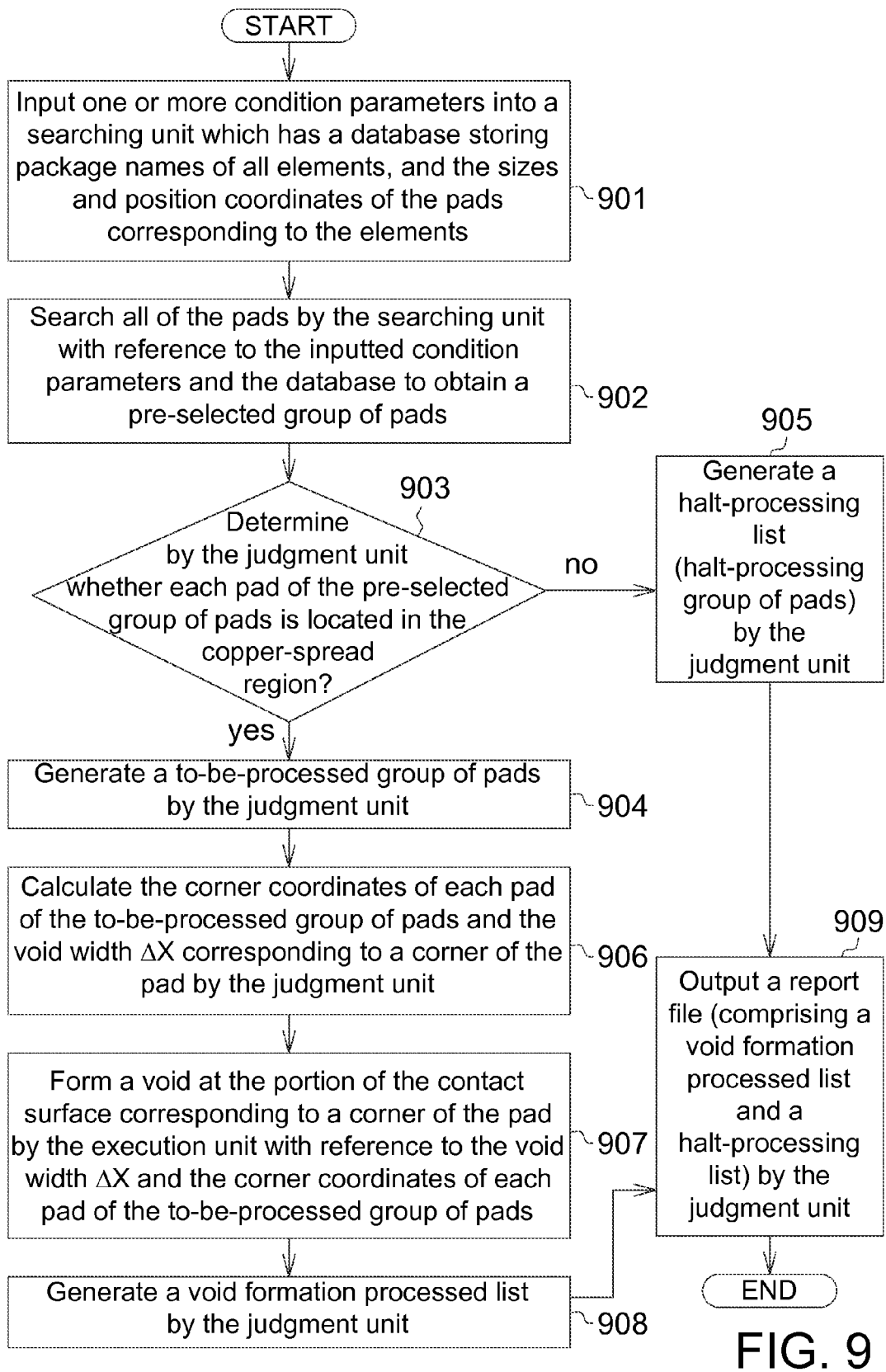
FIG. 9 is a flowchart of a method for forming voids according to a second application example of the disclosure.

FIG. 9 is a flowchart of a method for forming voids according to a second application example of the disclosure. In step 901, one or more condition parameters are inputted into a searching unit which has a database storing package names of all elements, and the sizes and position coordinates of the pads corresponding to the elements. In step 902, the searching unit searches all of the pads with reference to the inputted condition parameters and database to obtain a pre-selected group of pads. In step 903, the judgment unit determines whether each pad of the pre-selected group of pads is located in the copper region (that is, meets a pre-determined processing requirement). If the pad is located in the copper region, then the method proceeds to step 904. In step 904, the pad is categorized into a to-be-processed group of pads. If the pad is not located in the copper region, then the method proceeds to step 905. In step 905, the pad is categorized into a halt-processing group of pads. In step 906, the judgment unit calculates the corner coordinates of each pad of the to-be-processed group of pads and the void width ΔX corresponding to a corner of the pad. In step 907, the execution unit forms a void at the portion of the contact surface corresponding to a corner of the pad with reference to the corner coordinates of each pad of the to-be-processed group of pads and the void width ΔX. In step 908, after the execution unit finishes a void formation step, the judgment unit generates a void formation processed list. In step 909, the judgment unit outputs a report file comprising a void formation processed list and a halt-processing list. The program pops a report file, and the method terminates.

According to the method for forming voids and the structure with voids formed using the same disclosed in above embodiments, a void is formed at the portion of a contact surface (such as a copper foil) corresponding to a corner of the pad (such as the four corners of the pad), such that the contact area between the pad and the contact surface (such as the copper foil) is sufficient, characteristics of elements are maintained, and the tombstone effect of components can be reduced. In an embodiment, a data processor, which executes logic processing and operation, generates a to-be-processed group of pads with reference to the inputted conditions and executes a void formation step on the selected pads, such that the processing time can be reduced, and the sizes and positions of the pads are formed in a regular manner. Through a program interface with suitable design, the void formation can be more flexibly selected and the inputted conditions can be modified to meet the requirements of different applications. Therefore, the void formation can be executed more effectively and flexibly, the tombstone effect of components can be reduced, and product conformity rate can be increased.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A structure with voids, comprising:
   a circuit board, comprising at least a copper foil having a pad region, wherein the pad region has at least a void with width $X_V$ and length $Y_V$, and a perimeter of the void is equal to two times a sum of the width $X_V$ and the length $Y_V$;
   a pad with width $X_P$ and length $Y_P$, and the void of the pad region positioned corresponding to a corner of the pad, wherein the pad is disposed in the pad region for electrically connecting an element of the pad to the circuit board, and has a perimeter equal to two times a sum of the width $X_P$ and the length $Y_P$, the width $X_V$ and the length $Y_V$ of the void are smaller than the width $X_P$ and the length $Y_P$ of the pad, respectively, wherein, the pad has a minimum wire width W, and the difference obtained by deducting the perimeter of the void from the perimeter of the pad must be greater than or equal to the minimum wire width W.

2. The structure according to claim 1, wherein the pad region has the four voids corresponding to the four corners of the pad respectively.

3. The structure according to claim 2, wherein the voids have identical sizes.

4. The structure according to claim 2, wherein the voids are square in shape.

\* \* \* \* \*